US011901896B2

(12) United States Patent
Weber et al.

(10) Patent No.: US 11,901,896 B2
(45) Date of Patent: Feb. 13, 2024

(54) SOFT NETWORK-ON-CHIP OVERLAY THROUGH A PARTIAL RECONFIGURATION REGION

(71) Applicant: Intel Corporation, Santa Clara, CA (US)

(72) Inventors: Scott Jeremy Weber, Piedmont, CA (US); Ilya K. Ganusov, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 17/357,869

(22) Filed: Jun. 24, 2021

(65) Prior Publication Data

US 2021/0320661 A1  Oct. 14, 2021

Related U.S. Application Data

(60) Provisional application No. 63/044,850, filed on Jun. 26, 2020.

(51) Int. Cl.
*H03K 19/17756* (2020.01)
*H03K 19/17736* (2020.01)

(52) U.S. Cl.
CPC . *H03K 19/17756* (2013.01); *H03K 19/17736* (2013.01)

(58) Field of Classification Search
None
See application file for complete search history.

(56) References Cited

U.S. PATENT DOCUMENTS 10,922,471 B2  2/2021  Baeckler et al.
2020/0119736 A1*  4/2020  Weber .............. H03K 19/17756

OTHER PUBLICATIONS

Intel. "Understanding How the New Intel® HyperFlex™ FPGA Architecture Enables Next-Generation High-Performance Systems", White Paper.

* cited by examiner

*Primary Examiner* — Jany Richardson
(74) *Attorney, Agent, or Firm* — Fletcher Yoder, P.C.

(57) ABSTRACT

An integrated circuit device includes a programmable logic fabric that has programmable logic circuitry and a partial reconfiguration region. The integrated circuit device also includes a network-on-chip formed in soft logic of the integrated circuit device. Additionally, the network-on-chip is configurable to remain operable during a partial reconfiguration of the partial reconfiguration region.

20 Claims, 15 Drawing Sheets

SOFT NETWORK-ON-CHIP OVERLAY THROUGH A PARTIAL RECONFIGURATION REGION

CROSS-REFERENCE TO RELATED APPLICATIONS

This application claims priority from and the benefit of U.S. Provisional Application Ser. No. 63/044,850, entitled "Soft Network-on-Chip Overlay Through a Partial Reconfiguration Region," filed Jun. 26, 2020, which is hereby incorporated by reference in its entirety for all purposes.

BACKGROUND

This disclosure generally relates to integrated circuits, such as field-programmable gate arrays (FPGAs). More particularly, the present disclosure relates to the design and implementation of networks-on-chip (NOCs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits can be utilized to perform various functions, such as encryption and machine learning. Moreover, various portions of integrated circuits may be utilized to perform various operations. For example, one portion of an integrated circuit may perform one function to data, and another portion of the integrated circuit may be utilized to further process the data. NOCs may be utilized to route communication between different portions of an integrated circuit or for communication between multiple integrated circuits. For example, soft NOCs may be generated by software utilized to program an integrated circuit. However, soft NOCs may perform inconsistently, operate at relatively low speeds, and be unable to route wide busses across long spans of the integrated circuit. Moreover, it may be difficult to control the distribution of relatively small numbers of bits of data across an integrated circuit using soft NOCs. Furthermore, existing soft NOCs may not leverage the fine granularity of partial reconfiguration regions, fully utilize the ability to route wires, or harness those wires freely within partial reconfiguration regions. Lastly, existing soft NOCs may be fused with a static configuration. When changes are made to the design of such soft NOCs, the operation of the NOCs may be affected.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
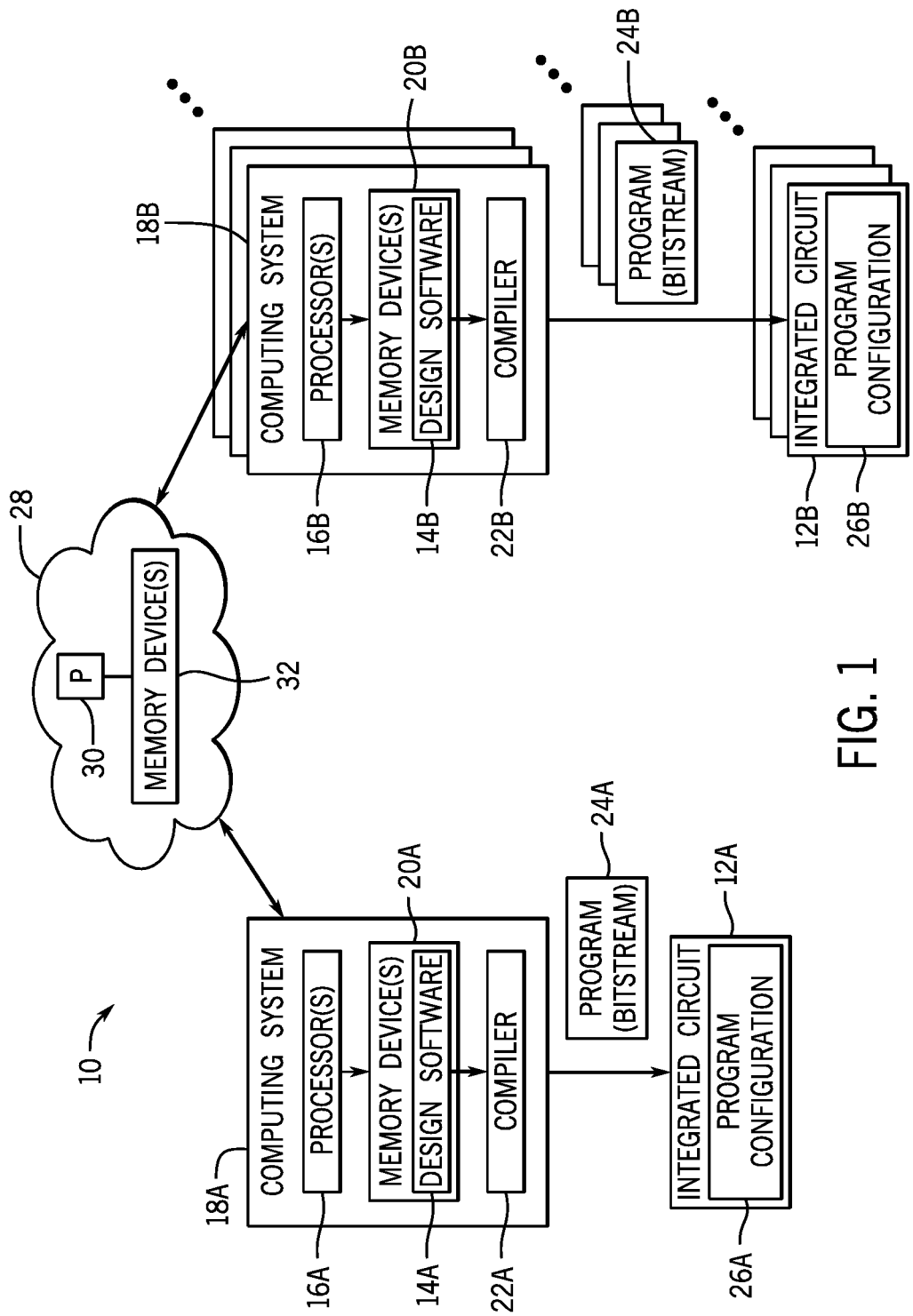
FIG. 1 is a block diagram of a system for implementing circuit designs on a programmable logic device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

As used herein, "hard logic" generally refers to portions of an integrated circuit device (e.g., a programmable logic device) that are not programmable by an end user, and the portions of the integrated circuit device that are programmable by the end user are considered "soft logic." For example, hard logic elements in a programmable logic device such as an FPGA may include arithmetic units (e.g., digital signal processing (DSP) blocks) that are included in the FPGA and unchangeable by the end user, whereas soft logic includes programmable logic elements included in the FPGA.

This disclosure describes using a soft NOC as an overlay that interacts and/or traverses over or through a partial reconfiguration region with the option of fusing to a static configuration. As a static overlay, this has an advantage that the design under the soft NOC can change without affecting the soft NOC's operation. For instance, when a partial reconfiguration that alters circuitry (e.g., programmable logic located in a partial reconfiguration region undergoing the partial reconfiguration) of an integrated circuit device, a soft NOC that interacts with or traverses the partial reconfiguration region may continue to operate normally. Additionally, a soft NOC may have an advantage over a hard NOC because a soft NOC may only use resources as called for by a design. Moreover, the soft NOCs described herein may use long wires which have low utilization. Therefore, the NOCs disclosed herein may not impact the routability of the persona in the partial reconfiguration region that the soft NOC traverses.

More specifically, the techniques described herein provide the ability to construct a point-to-point network-on-chip (NOC) using FPGA soft logic in a hierarchical construction where the soft NOC is a static overlay that is embedded inside a partial reconfiguration region. Partial reconfiguration personas that are loaded into the partial reconfiguration region can interface with the soft NOC to transport data. Furthermore, during a partial reconfiguration operation (e.g., reconfiguring a partial reconfiguration region to switch from performing a first function associated with a first persona to performing a second function associated with a second persona), the soft NOC remains active, thereby enabling uninterrupted data transport through the partial reconfiguration region. If partial reconfiguration functionality is not desired, the soft NOC overlay can be fused with a design to provide a completely static solution. In particular, the techniques described below harness programmable logic devices' (e.g., FPGAs') capabilities to construct a static region soft NOC from routing, an integrated circuit's core architecture (e.g., Intel® HyperFlex™ FPGA Architecture) and islands or lanes of a static region (e.g., an intellectual property (IP) block or portion of an integrated circuit device that is not partially reconfigurable) that goes through a partial reconfiguration region. The construction of the soft NOC overlay is such that its Quality of Result (QoR) impact with the underlying partial reconfiguration personas is minimal to none.

Soft NOCs described herein take advantage of the fine-grained partial reconfiguration regions and architecture (e.g., HyperFlex™) capabilities of certain programmable logic devices, such as FPGAs (e.g., Intel Stratix® 10 and Agilex™ FPGAs). For instance, a programmable logic device may include Hyper-Registers, which may also be referred to herein as "Hyperflex registers" or "specialized registers." Hyper-Registers are registers in which a routing signal can travel through a register of the hyper-register first or bypass the register to go directly to a multiplexer of the hyper-register, thereby improving bandwidth as well as area and power efficiency. For example, Hyper-Registers may be used for retiming and pipelining critical paths, thereby improving design efficiency and data throughput. Additionally, intellectual property (IP) blocks (e.g., logic array blocks (LABs), memory logic array blocks (MLABs), digital signal processing (DSP) blocks, M20K memory blocks) may be individually assigned to a static region or a partial reconfiguration region. This fine-grained partial reconfiguration architecture allows lanes or islands of static logic to be inter-mixed within a partial reconfiguration region. The partial reconfiguration granularity on routing is even more fine-grained where individual routing multiplexers may be assigned to a static or partial reconfiguration region. This granularity in the routing allows static routes to go through a partial reconfiguration region. Furthermore, the routing architecture of programmable logic devices (e.g., FPGAs) allows these static routes to support high frequencies across long distances through the partial reconfiguration regions. These unique features provide a platform for constructing high-speed point-to-point soft NOCs within partial reconfiguration regions.

With the foregoing in mind, FIG. 1 illustrates a block diagram of a system 10 that may be used to program one or more integrated circuit device 12 (e.g., integrated circuit devices 12A, 12B). The integrated circuit device 12 may be reconfigurable (e.g., FPGA) or may be an application-specific integrated circuit (ASIC). A user may implement a circuit design to be programmed onto the integrated circuit device 12 using design software 14, such as a version of Intel® Quartus® by INTEL CORPORATION.

The design software 14 may be executed by one or more processors 16 of a respective computing system 18. The computing system 18 may include any suitable device capable of executing the design software 14, such as a desktop computer, a laptop, a mobile electronic device, a server, or the like. The computing system 18 may access, configure, and/or communicate with the integrated circuit device 12. The processor(s) 16 may include multiple microprocessors, one or more other integrated circuits (e.g., ASICs, FPGAs, reduced instruction set processors, and the like), or some combination of these.

One or more memory devices 20 may store the design software 14. In addition, the memory device(s) 20 may store information related to the integrated circuit device 12, such as control software, configuration software, look up tables, configuration data, etc. In some embodiments, the processor(s) 16 and/or the memory device(s) 20 may be external to the computing system 18. The memory device(s) 20 may include a tangible, non-transitory, machine-readable-medium, such as a volatile memory (e.g., a random access memory (RAM)) and/or a nonvolatile memory (e.g., a read-only memory (ROM)). The memory device(s) 20 may store a variety of information that may be used for various purposes. For example, the memory device(s) 20 may store machine-readable and/or processor-executable instructions (e.g., firmware or software) for the processor(s) 16 to execute, such as instructions to determine a speed of the integrated circuit device 12 or a region of the integrated circuit device 12, determine a criticality of a path of a design programmed in the integrated circuit device 12 or a region of the integrated circuit device 12, programming the design in the integrated circuit device 12 or a region of the integrated circuit device 12, and the like. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design software 14 may use a compiler 22 to generate a low-level circuit-design program 24 (bitstream), sometimes known as a program object file, which programs the integrated circuit device 12. That is, the compiler 22 may provide machine-readable instructions representative of the circuit design to the integrated circuit device 12. For example, the integrated circuit device 12 may receive one or more programs 24 as bitstreams that describe the hardware implementations that should be stored in the integrated circuit device 12. The programs 24 (bitstreams) may programmed into the integrated circuit device 12 as a program configuration 26 (e.g., program configuration 26A, program configuration 26B).

As illustrated, the system 10 also includes a cloud computing system 28 that may be communicatively coupled to the computing systems 18, for example, via the internet or a network connection. The cloud computing system 28 may include processing circuitry 30 and one or more memory devices 32. The memory device(s) 32 may store information related to the integrated circuit device 12, such as control software, configuration software, look up tables, configuration data, etc. The memory device(s) 32 may include a tangible, non-transitory, machine-readable-medium, such as a volatile memory (e.g., a random access memory (RAM)) and/or a nonvolatile memory (e.g., a read-only memory (ROM)). The memory device(s) 32 may store a variety of information that may be used for various purposes. For example, the memory device(s) 32 may store machine-readable and/or processor-executable instructions (e.g., firmware or software) for the processing circuitry 30 to execute. Additionally, the memory device(s) 32 of the cloud computing system 28 may include programs 24 and circuit designs previously made by designers and the computing systems 18. The memory device(s) 32 may also include one or more libraries of chip-specific predefined locations and fixed routes that may be utilized to generate a NOC. When a designer is utilizing the design software 14, the processor(s) 16 may request information regarding NOCs previously designed by other designers or implemented on other integrated circuit device 12. For instance, a designer who is working on programming the integrated circuit device 12A may utilize the design software 14A and processor(s) 16A to request a design for a NOC used on another integrated circuit (e.g., integrated circuit device 12B) from the cloud computing system 28. The processing circuitry 30 may generate and/or retrieve a design of a NOC from the memory devices(s) 32 and provide the design to the computing system 18A. Additionally, the cloud computing system 28 may provide information regarding the predefined locations and fixed routes for a NOC to the computing system 18A based on the specific integrated circuit device 12A (e.g., a particular chip). Furthermore, the memory device(s) 32 may keep records and/or store designs that are used to provide NOCs with regularized structures, and the processing circuitry 30 may select specific NOCs based on the integrated circuit device 12A as well as design considerations of the designer (e.g., amounts of data to be transferred, desired speed of data transmission).

Figure 2:
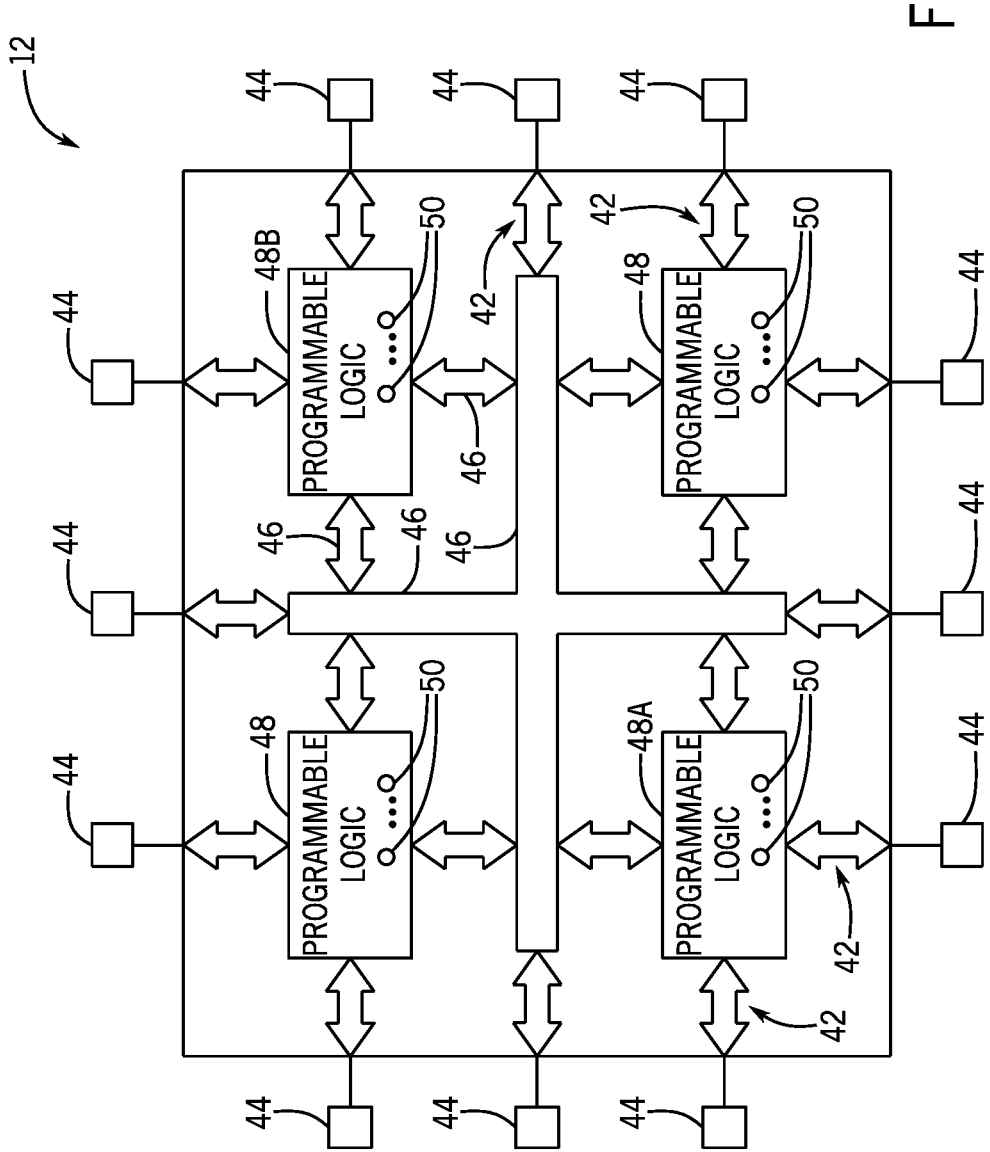
FIG. 2 is a block diagram of the programmable logic device of FIG. 1, in accordance with an embodiment.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of programmable logic device (e.g., an application-specific integrated circuit and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects), such as the soft NOCs disclosed herein. Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as integrated circuit device 12, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Furthermore, it should be noted that the programmable logic 48 may correspond to different portions or sectors on the integrated circuit device 12. That is, the integrated circuit device 12 may be sectorized, meaning that programmable logic resources may be distributed through a number of discrete programmable logic sectors (e.g., each programmable logic 48). In some cases, sectors may be programmed to perform specific tasks. For example, a first sector (e.g., programmable logic 48A) may perform a first operation on data. The interconnect resources 46, which may include a NOC designed using the design software 14, may be utilized to provide the data to another sector (e.g., programmable logic 48B), which may perform further operations on the data. As discussed below, the soft NOC may provide a regularized, predictable way to provide large amounts of data between computing elements (e.g., between different portions of the programmable logic 48).

As discussed below, the integrated circuit device 12 may include a specialized register architecture that may improve the efficiency of the integrated circuit device 12 by using specialized registers (e.g., Hyper-Registers) for retiming and pipelining critical paths rather than using functional registers included in the programmable logic 48. Furthermore, using specialized register may be less expensive (e.g., financially and/or in terms of area on the integrated circuit device 12 utilized) within the architecture than the programmable logic 48 because the programmable logic 48 includes more components than a register. More specifically, the specialized register architecture may include routing segments that include specialized registers, which may include a register and a multiplexer. Routing signals of the routing segments can travel through the register of the specialized register first or bypass the register to go directly to the multiplexer of the specialized register, thereby improving bandwidth as well as area and power efficiency.

Figure 3:
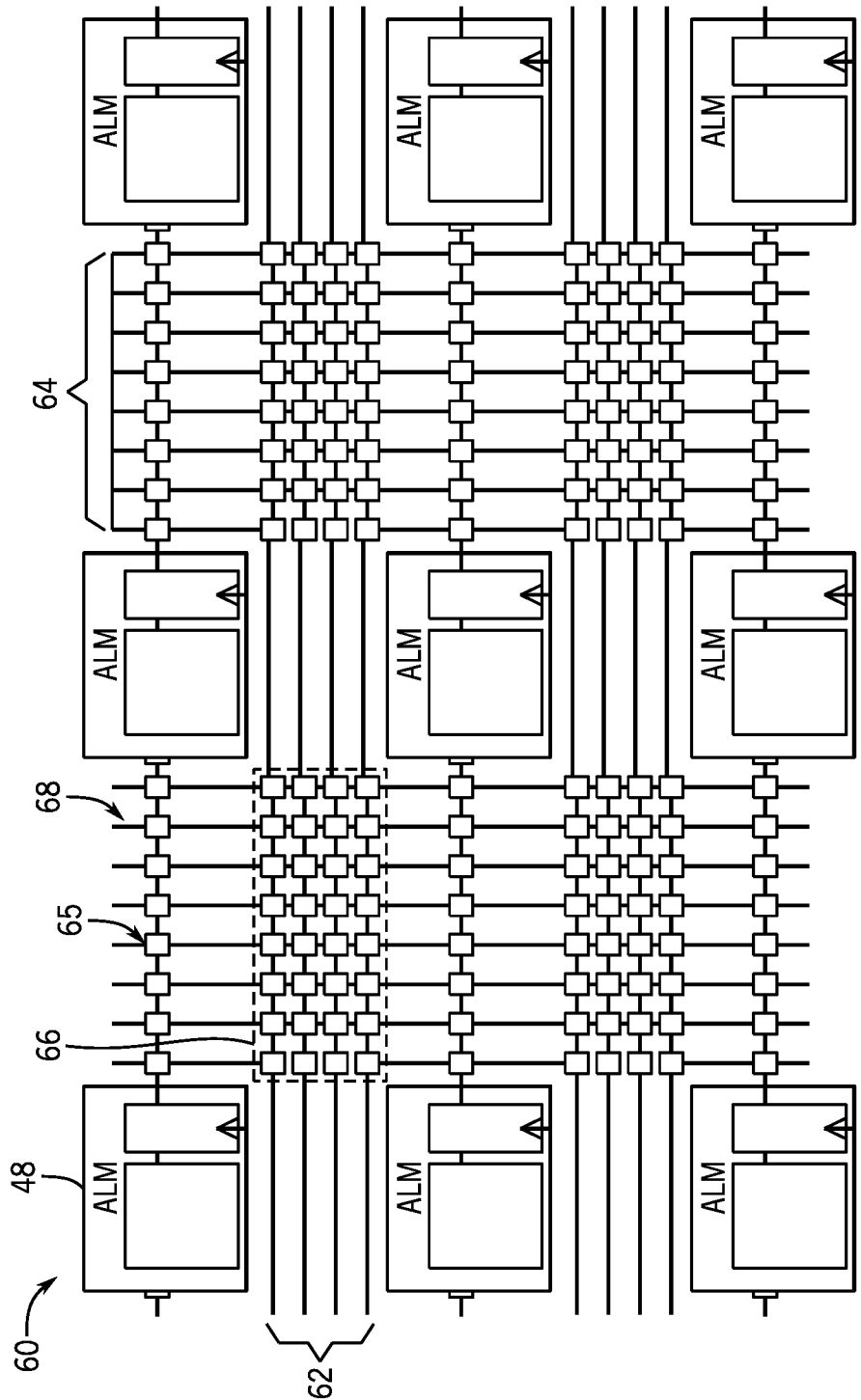
FIG. 3 is a block diagram of a specialized register architecture that may be implemented on the programmable logic device of FIG. 1, in accordance with an embodiment.

With the foregoing in mind, FIG. 3 illustrates a specialized register architecture 60 that may be included in the integrated circuit device 12. The specialized register architecture 60 may include programmable logic 48 (e.g., adaptive logic modules (ALMs)), horizontal routing segments 62, vertical routing segments 64, and specialized registers 65 (e.g., Hyper-Registers). The specialized registers 65 may be included at inputs of the programmable logic 48 as well as along the horizontal routing segments 62 and vertical routing segments 64 (e.g., within a group 66 of specialized registers 65 where there are intersections 68 between the horizontal routing segments 62 and vertical routing segments 64). It should be appreciated the horizontal routing segments 62 and the vertical routing segments 64 may be wires included in the integrated circuit device 12 that are utilized to transport data. Furthermore, the horizontal routing segments 62 and vertical routing segments 64 may be collectively referred to as "routing segments."

The routing segments 62, 64 may intersect at multiple locations within the specialized register architecture 60 to form the intersections 68. A specialized register 65 of the group 66 of specialized registers 65 may be disposed at each of the intersections 68. The specialized registers 65 may be programmed via configuration bits input into the specialized register architecture 60 (e.g., sent from control logic included in the integrated circuit device 12).

The specialized registers 65 may be configured in an "on" mode or an "off" mode. With this feature, pipeline registers may be located without using the programmable logic 48. A designer of the integrated circuit device 12 may take advantage of the fact that pipeline registers can be located with using the programmable logic 48 and may retime and pipeline without consuming additional logic array block (LAB) resources that may be included in the integrated circuit device 12. In some embodiments, the specialized register architecture 60 may use fewer LAB resources because the specialized register architecture 60 may utilize the specialized registers 65 to route data.

Figure 4:
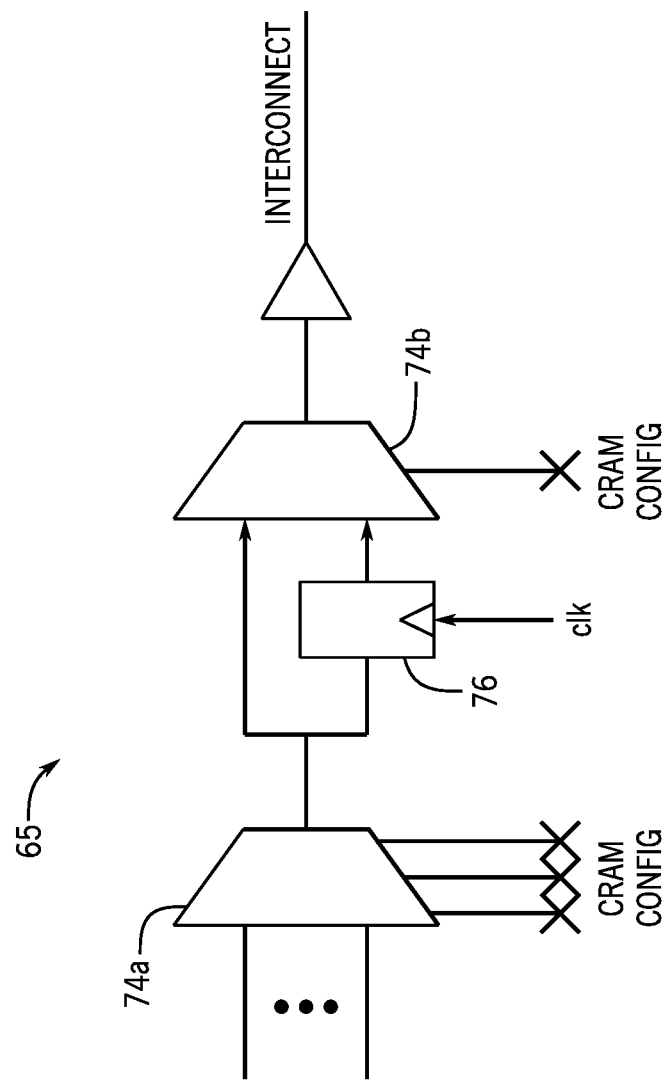
FIG. 4 is a block diagram of a routing multiplexer with a specialized register that may be included in the, in accordance with an embodiment.

FIG. 4 illustrates a specialized register 65. The specialized register 65 may include one or multiple routing multiplexers 74 (e.g., multiplexers 74A, 74B) and a register 76. For instance, in the illustrated embodiment, the register 76 is disposed between two multiplexers 74A, 74B. In other embodiments, the specialized register 65 may include a single multiplexer (e.g., multiplexer 74B) and the register 76. The specialized registers 65 may receive a routing signal (e.g., an output of the multiplexer 74A), which can travel through the register 76 or bypass the register 76 to go directly to the multiplexer 76B, thereby improving bandwidth as well as area and power efficiency.

Figure 5:
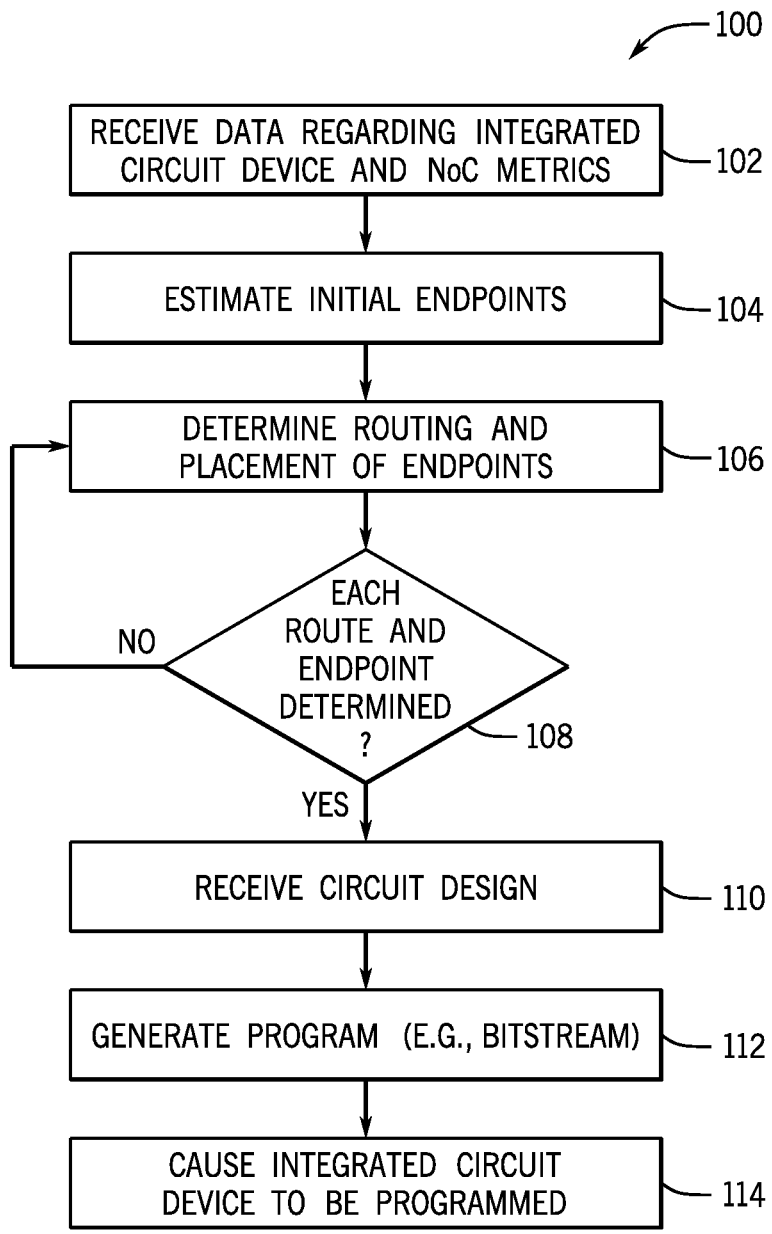
FIG. 5 is a flow diagram of a process for implementing a NOC on an integrated circuit, in accordance with an embodiment.

Continuing with the drawings, FIG. 5 is a flow diagram of a process 100 for implementing a NOC on an integrated circuit device. The processor(s) 16A of the computing system 18A may perform the process 100 to cause a NOC to be implemented on the integrated circuit device 12A. Additionally, the process 100 may be performed by the computing system 18A in combination with the cloud computing system 28. The process 100 generally includes receiving data regarding the integrated circuit device 12A and NOC metrics (process block 102), estimating initial endpoints, which may also be referred to as "source points" (process block 104), determining routing and placement of endpoints (process block 106), determining whether each route and endpoint has been determined (decision block 108), and determining routing and placement of endpoints upon determining that some routes or endpoints have not been determined (process block 106). When it is determined that each route and endpoint has been determined, the process 100 also includes receiving a circuit design (process block 110), generating the program (bitstream) 24A (process block 112), and causing the integrated circuit device 12A to be programmed (process block 114).

At process block 102, the computing system 18A may receive information regarding the integrated circuit device 12A as well as metrics associated with a NOC to be developed and implemented onto the integrated circuit device 12A. The information may be received from the cloud computing system 28. The information regarding the integrated circuit device 12A may include information regarding the particular integrated circuit device 12A, such as a particular model of the integrated circuit device 12A (e.g., a specific chip), as well as characteristics associated with the particular integrated circuit device 12A. The metrics associated with the NOC may include bus width (e.g., number of wires), bus speed (e.g., a value in hertz), a target performance level, a target performance level threshold range, and a number of clock cycle delays between sources and sinks. Some of the NOC metrics may be received from the cloud computing system 28. For example, bus width and bus speed may be information specific to a particular type of the integrated circuit device 12A that may be stored on the memory device(s) 32. Additionally, the target performance level and target performance level threshold range may be received via a user input from designer utilizing the design software 14A. In other embodiments, the processor(s) 16A may determine the target performance level and the target performance level threshold range. For instance, a default number or percentage may be used to determine the target performance level threshold range. For example, if the target performance level is the 600 megahertz (MHz), the threshold range may be defined by a specific amount above or below 600 MHz, such as 580-620 MHz (i.e., within 20 MHz of 600 MHz). Keeping the same example of the target performance level being 600 MHZ, the target performance level threshold range may be defined by a specific percentage above or below 600 MHz, such as 570-630 MHz (i.e., within five percent of 600 MHz). Additionally, the designer may set the target performance level threshold range based on an amount (e.g., a number of megahertz) or a percentage value (e.g., five percent). Also, the designer may set a higher number of flops (floating point operations per second), which may result in a higher target performance level (e.g., a higher maximum frequency).

At process block 104, the computing system 18A may estimate endpoints for the NOC. As an example, endpoints may include registers (e.g., specialized registers 65) that are relatively close to, or neighbor, points between a data source (e.g., a portion of programmable logic 48 where data originates) and a destination (e.g., another portion of the programmable logic 48 where the data is to be sent). As another example, the endpoints may refer to a "spine" (e.g., a column) of registers from which "ribs" (e.g., rows) of registers will subsequently be generated.

Continuing with the process 100, at process block 106, the computer system 18A may determine routing information and the placement of endpoints. Determining the placement of endpoints may include determining where other registers or register blocks should be located, and determining routing information includes determining a route (e.g., particular wires) between the endpoints and other endpoints, such as endpoints determined at process block 104.

At decision block 108, the computing system 18A may determine whether each endpoint and route has been determined. In other words, the computing system 18A may determine whether a complete NOC that will operate in accordance with a designer's desired performance has been designed. For example, the computing system 18A may determine whether more registers or routes should be added to a NOC design. If the computing system 18A determines that each route and endpoint has not been determined, the computing system may return to process block 106 and determine additional routing information, the placement of additional endpoints, or both. That is, many iterations of the process 200 or portions thereof may be performed to develop a NOC, such as one of the NOCs discussed below. For example, while determining register placement and routing information in a NOC, the computing system 18A may make adjustments to the locations of registers and/or modify which wires are to be utilized until the expected performance associated with destination registers (e.g., a register block) is within the target performance level threshold range, any clock considerations have been accounted for, and there are no route discontinuities (e.g., there were no discontinuities or the discontinuities have been accounted for). The registers or register blocks may be described as being added in "layers" in which destination registers are placed based on the locations of other registers that have been set (e.g., source registers). After the placement of destination registers is confirmed, the destination registers may be saved as source registers, and associated route information may also be saved. More layers of registers may be added until a NOC is complete. In other words, at decision block 108, the computing system 18A may determine whether a NOC design is complete.

If at decision block 108 the computing system 18A determines that each endpoint (e.g., each register or register block) and associated routes have been determined, at process block 110, the computing system 18A may receive a circuit design. For example, the circuit design may be a high-level programming language description of a hardware implementation for the integrated circuit device 12A written by designer using the design software 14A. At process block 112, the computing system 18A may generate a program or bitstream, such as the program (bitstream) 24. For instance, as noted above, the compiler 22A may generate the program 24, which may be a low-level circuit design that describes hardware implementations to be stored on the integrated circuit device 12A.

A NOC may be described in the program 24. However, it should be noted that the NOC, including registers utilized as well as routing information (e.g., particular wires utilized between registers) may be defined before compiling. In other words, a design for a NOC may be made independent of, as well as before, compiling is performed. When generating the program 24, the computing system 18A may program the programmable elements 50 of the programmable logic 48 of the integrated circuit device 12A based on a NOC design (e.g., a NOC to be implemented on the integrated circuit device 12A). For example, the computing system 18A and/or compiler 22 may determine portions of the programmable logic 48 that will not be utilized for a NOC. The program 24, when provided to the integrated circuit device 12A, may only cause portions of the programmable logic 48 that will not be utilized for the NOC to be programmed to perform operations described by the high-level programming language description provided to the compiler 22.

At process block 114, the computing system 18A may cause the integrated circuit device 12A to be programmed. For example, the computing system 18A may cause a hardware implementation described by the program 24 to be implemented on the integrated circuit device 12A by sending the program 24 to the integrated circuit device 12A. As noted above, the program 24 may include instructions for a NOC. Accordingly, a NOC may be implemented onto the programmable logic 48 of the integrated circuit device 12A at process block 114.

It should be noted that while the process 100 is described as being performed by the computing system 18A, in some embodiments, the process 100 may be performed by the computing system 18A and the cloud computing system 28 in combination. For example, the computing system 18A may provide information regarding the integrated circuit device 12A, such as a model (e.g., specific chip) of the integrated circuit device 12A, as well as a target performance level and/or target performance level threshold range. The processing circuitry 30 of the cloud computing system 28 may generate a NOC design for the integrated circuit device 12A using historical information, predefined locations (e.g., of registers), and/or fixed routes associated stored on the memory device(s) 32. For example, the memory device(s) may include data or statistics regarding previous programs implemented on the integrated circuit device 12A or integrated circuit 12B that are the same type of integrated circuit as the integrated circuit device 12A. The cloud computing system 28 may provide the NOC design to the processor(s) 16, and the NOC design may be implemented on the integrated circuit device 12A as described above.

Keeping the foregoing in mind, FIGS. 6-14 each illustrate different implementations of soft NOCs on the integrated circuit device 12. In particular, the soft NOCs may be implemented using static routing (e.g., a fixed route or pathway of the NOC that may be generated using the design software 14 and implemented onto the integrated circuit device 12 as discussed above).

Figure 6:
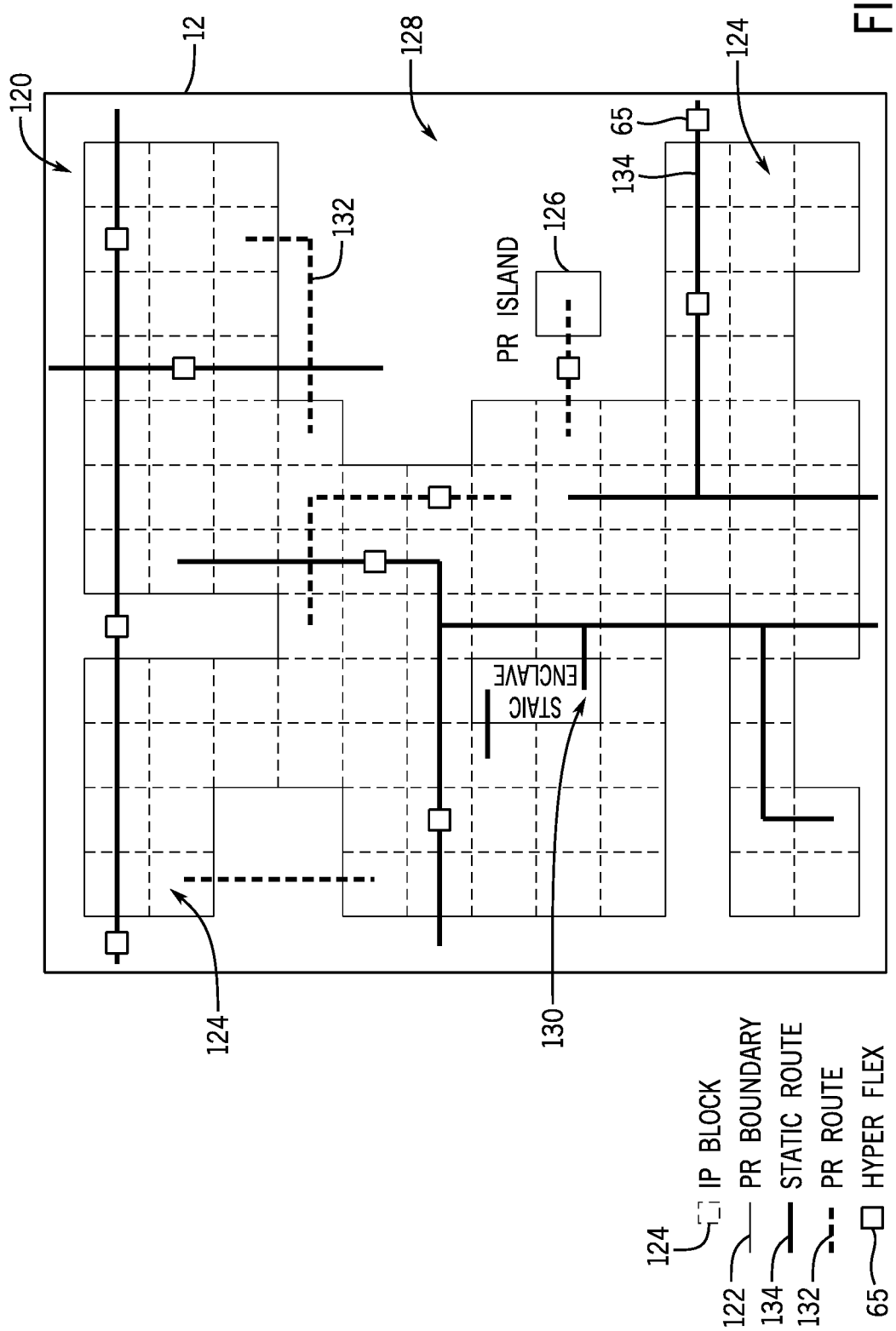
FIG. 6 is a block diagram of an integrated circuit device that includes point-to-point soft NOCs, in accordance with an embodiment.

FIG. 6 illustrates the fine-grained nature of partial reconfiguration and the use of architecture capabilities (e.g., provided by utilizing the specialized registers 65). Partial reconfiguration (PR) regions 120 may be defined by PR boundaries 122. Further, the PR regions 120 may have any geometry that is constructed of IP blocks 124 (e.g., logic array blocks (LABs), memory logic array blocks (MLABs), digital signal processing (DSP) blocks, M20K memory blocks). The IP blocks 124 may be within the PR boundaries 122 and may be structured with various geometries such as, but not limited to, geometries that include partial reconfiguration islands 126 of IP blocks 124 (e.g., portions of a partial reconfiguration region wholly surrounded by a static region 128) and/or static region enclaves 130 (e.g., portions of a static region 128 surrounded by a partial reconfiguration region 120). It should be noted that the static region 128 is the space within the integrated circuit 12 that is not within the bounds of the PR boundaries 122. Routing is freely mixed between the partial reconfiguration region 120 and static region 128, including PR routing 132 over static IP blocks and static routing 134 over partial reconfiguration IP blocks 124. The static routing 134 may be a NOC that is implemented on the integrated circuit device 12, while the PR routes 132 are routes that may be present for a particular configuration of the integrated circuit device 12. In other words, while PR routes 132 may no longer be present when the integrated circuit device undergoes a partial reconfiguration operation, the static routing 134 interacts with or traverses the partial reconfiguration region 120 and continues to operate normally during the partial reconfiguration operation. Furthermore, HyperFlex registers (e.g., specialized registers 65) on the static routing 134 and partial reconfiguration routing 132 may be utilized. For example, data may be routed from PR routes 132 to static routes 134 utilizing the specialized registers 65.

Figure 7:
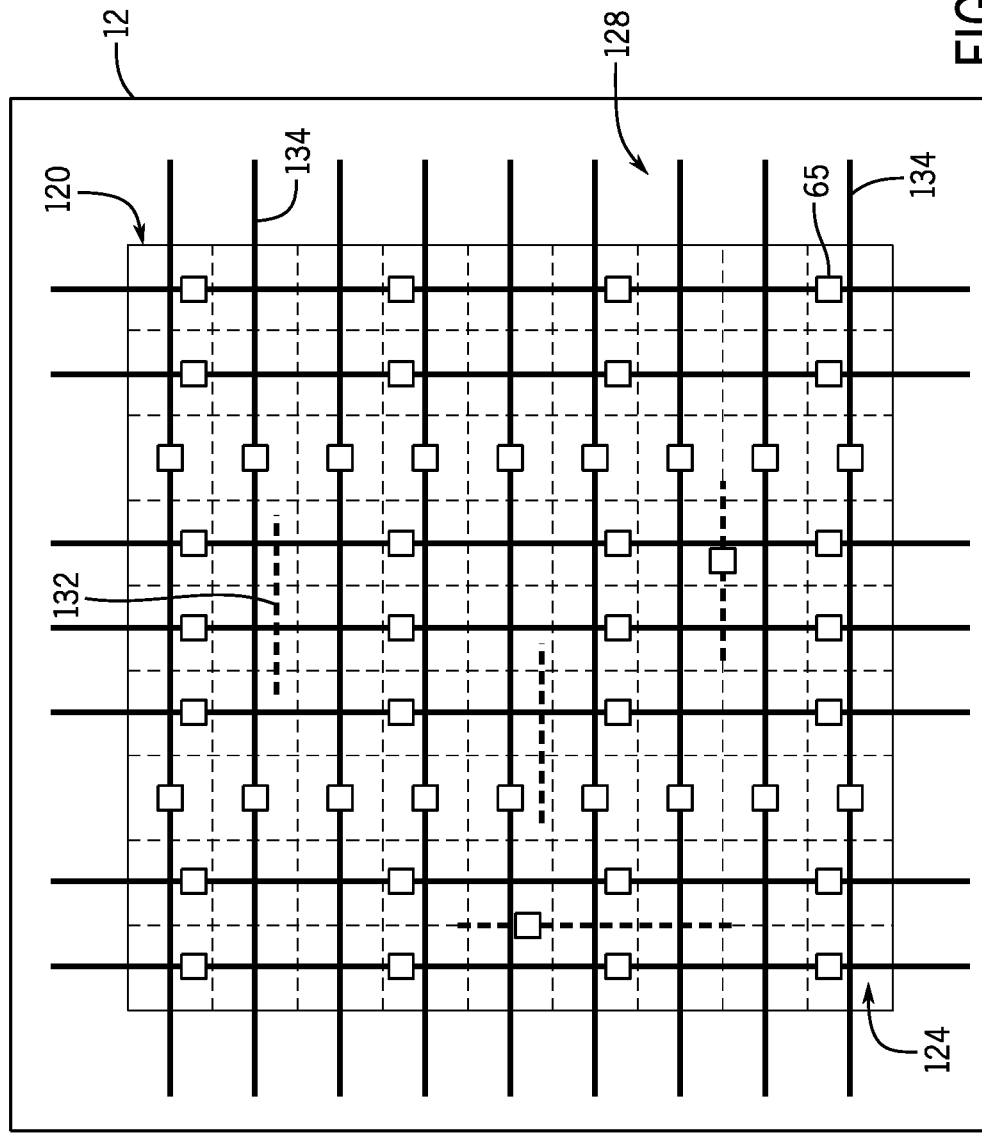
FIG. 7 is a block diagram of an integrated circuit device that includes a distributed soft NOC, in accordance with an embodiment.

Turning now to FIG. 7, in some embodiments, static point-to-point soft NOCs (as indicated by the static route 134) through a partial reconfiguration region are constructed as pipelined buses using only routing and specialized registers 65. In other words, in some embodiments, soft NOCs may be established without utilizing IP block 124 resources. This construction is called "distributed" because the pipelined wires are distributed across the entire partial reconfiguration region 120, as shown in FIG. 7. Utilizing a distributed soft NOC may reduce latency and cost because it uses specialized registers 65 for pipelining while leaving other resources of the integrated circuit device 12 (e.g., LAB resources) to be used by the IP blocks 124 of the integrated circuit device 12. Additionally, it should be noted that, in some embodiments, the distributed soft NOC overlay may span more than one partial reconfiguration region 120.

Figure 8:
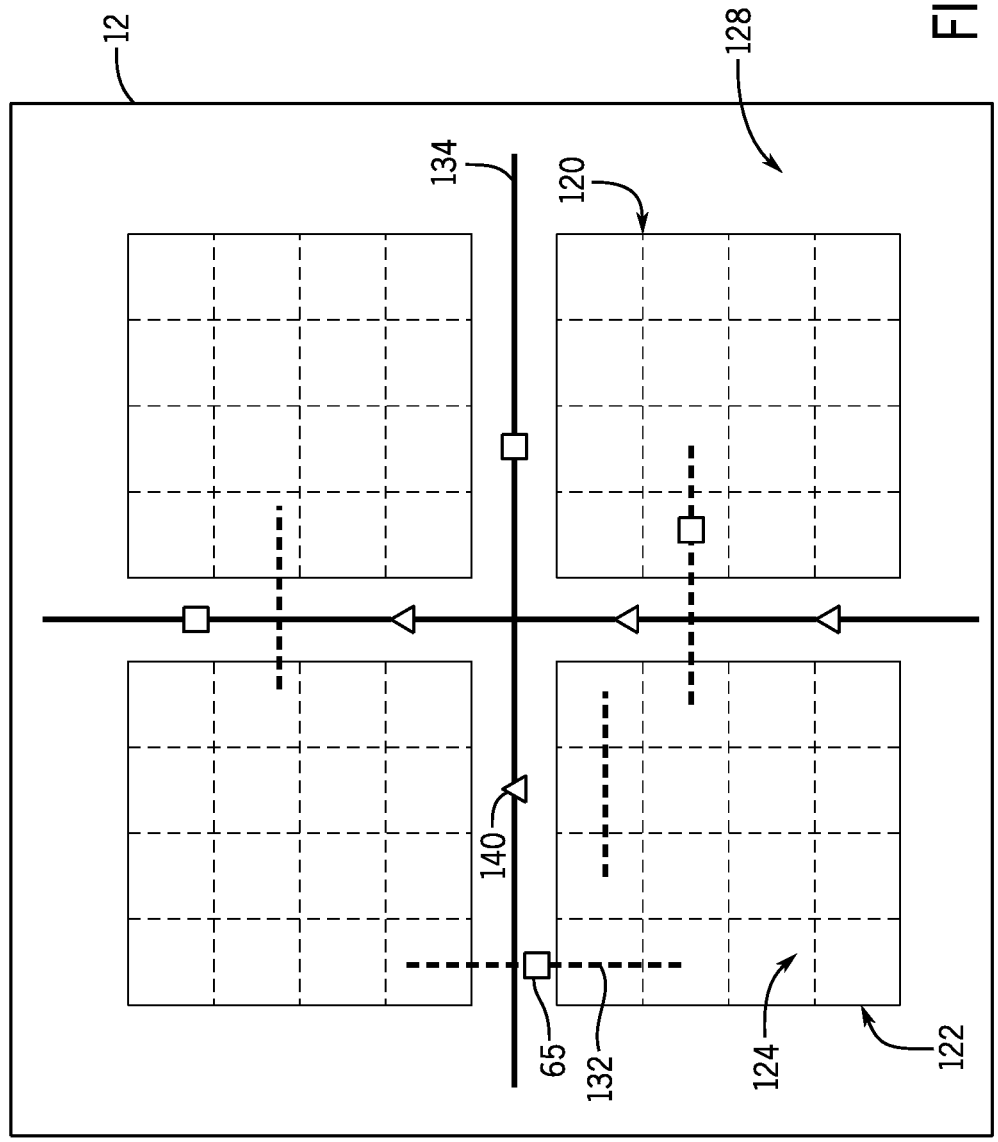
FIG. 8 is a block diagram of an integrated circuit device that includes a concentrated soft NOC, in accordance with an embodiment.

Continuing to FIG. 8, in some embodiments, static point-to-point soft NOCs through a partial reconfiguration region 120 are constructed as pipelined buses using lanes of IP blocks 124 allocated to the static region 128. For example, flip-flops of the static IP blocks (e.g., static regions) along with routing are used to construct the soft NOC. In some embodiments, distributed memories of the static IP blocks (e.g. adaptive logic module (ALM) flip-flops (FFs), look-up table (LUT) RAM, M20K blocks) along with routing are used to construct the soft NOC. In some embodiments, HyperFlex registers 65 are utilized. This construction is called "concentrated," as the bandwidth is much higher but concentrated to a lane of static IP blocks, as illustrated in FIG. 8. One benefit of the concentrated NOC is isolating routing resources used by the NOC from routing resources used by the user IP block(s) which may be preferable for designs with high degrees of routing congestion. Additionally, similar to distributed NOCs, concentrated soft NOC overlays may span more than one partial reconfiguration region 120.

Figure 9:
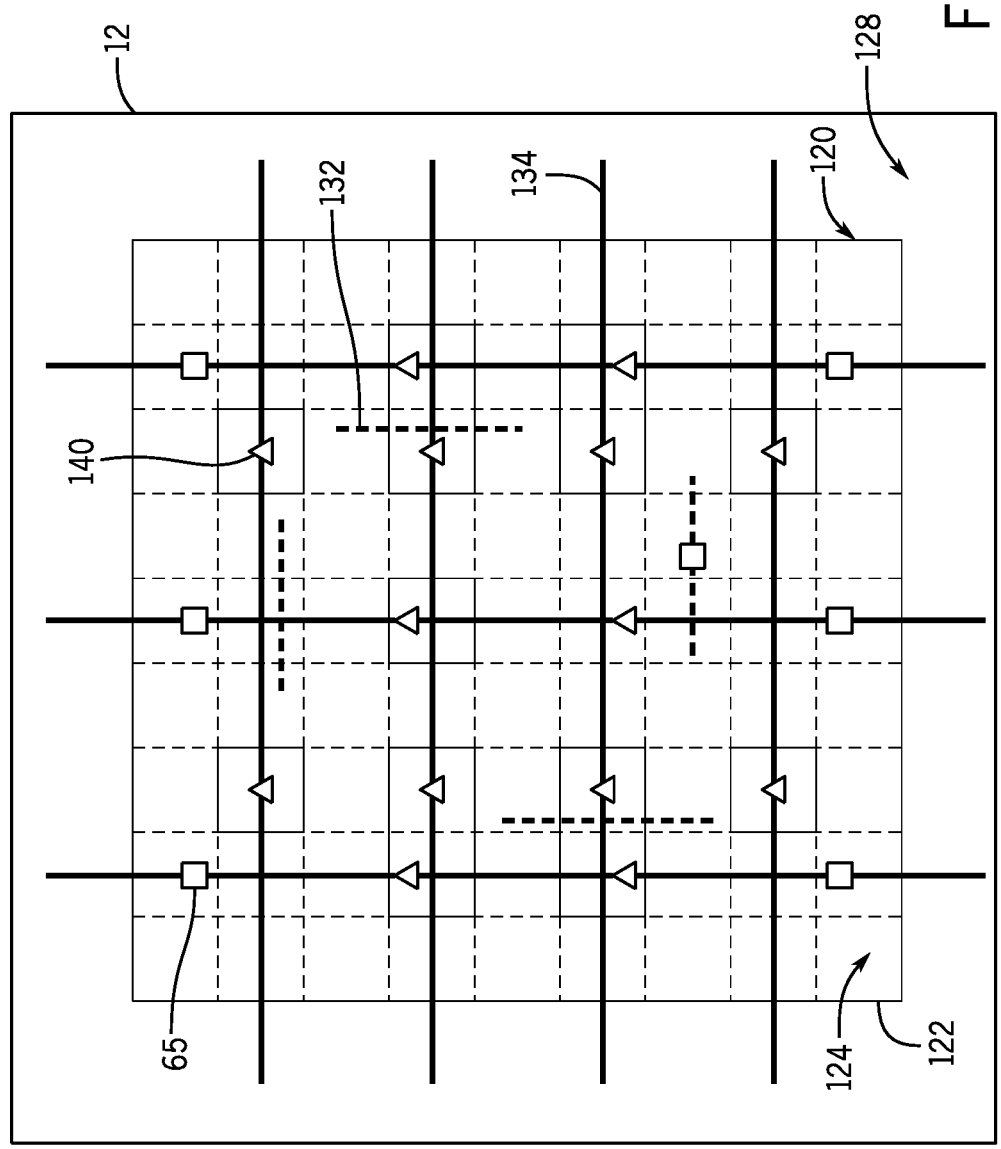
FIG. 9 is a block diagram of an integrated circuit device that includes an island-hopping soft NOC, in accordance with an embodiment.

Turning to FIG. 9, in other embodiments, static point-to-point soft NOCs through a partial reconfiguration region 120 are constructed as pipelined buses using enclaves of static IP blocks (e.g., static regions 128) from the point-of-view of the PR region 120. In other words, a static point-to-point NOC through a partial reconfiguration region 120 may utilize pipelined buses found in static regions 128 between partial reconfiguration regions or portions of a single partial reconfiguration region 120 (e.g., static regions 128). Such a construction is called "island hopping," as the pipelined wires land on islands (e.g., static regions 128) to use static IP resources as shown in FIG. 9. In some embodiments, the island hopping soft NOC overlay (indicated by the static route 134) may span more than one PR region 120. Advantageously, utilizing island-hopping may allow more elaborate IP construction beyond wires and specialized registers.

Figure 10:
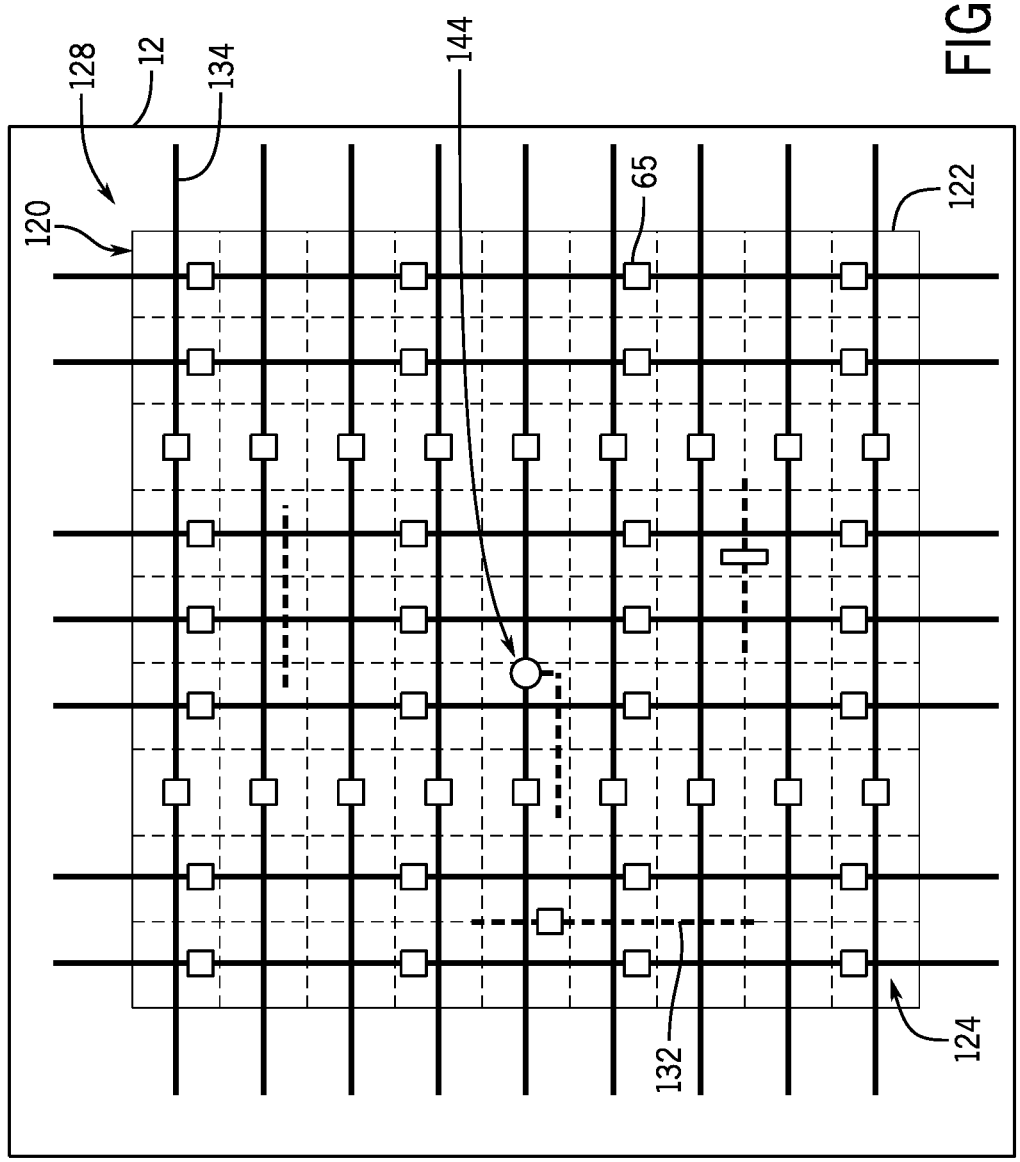
FIG. 10 is a block diagram of an integrated circuit device that includes a partial reconfiguration persona direct connection to a soft NOC, in accordance with an embodiment.

Soft NOCs may be used to transport static data over a partial reconfiguration region 120 without interacting with a partial reconfiguration persona in the partial reconfiguration region 120. Conversely, in some embodiments (e.g., the embodiment illustrated in FIG. 10), the soft NOC (indicated by the static route 134) connects the partial reconfiguration persona (e.g., at point 144) to provide transport. For example, in some cases, the partial reconfiguration persona connects to the soft NOC by stitching in routes to or from the partial reconfiguration persona to or from the soft NOC, as shown in FIG. 10. In some embodiments, the pipelined bus is reconfigured to disconnect portions of the pipelined bus to create a partial reconfiguration persona source to or from static region connections, as also shown in FIG. 10. Furthermore, while FIG. 10 depicts this in the context of the distributed soft NOC, in other embodiments, a similar transformation may be done for the concentrated or island-hopping versions of the soft NOC discussed above.

Figure 11:
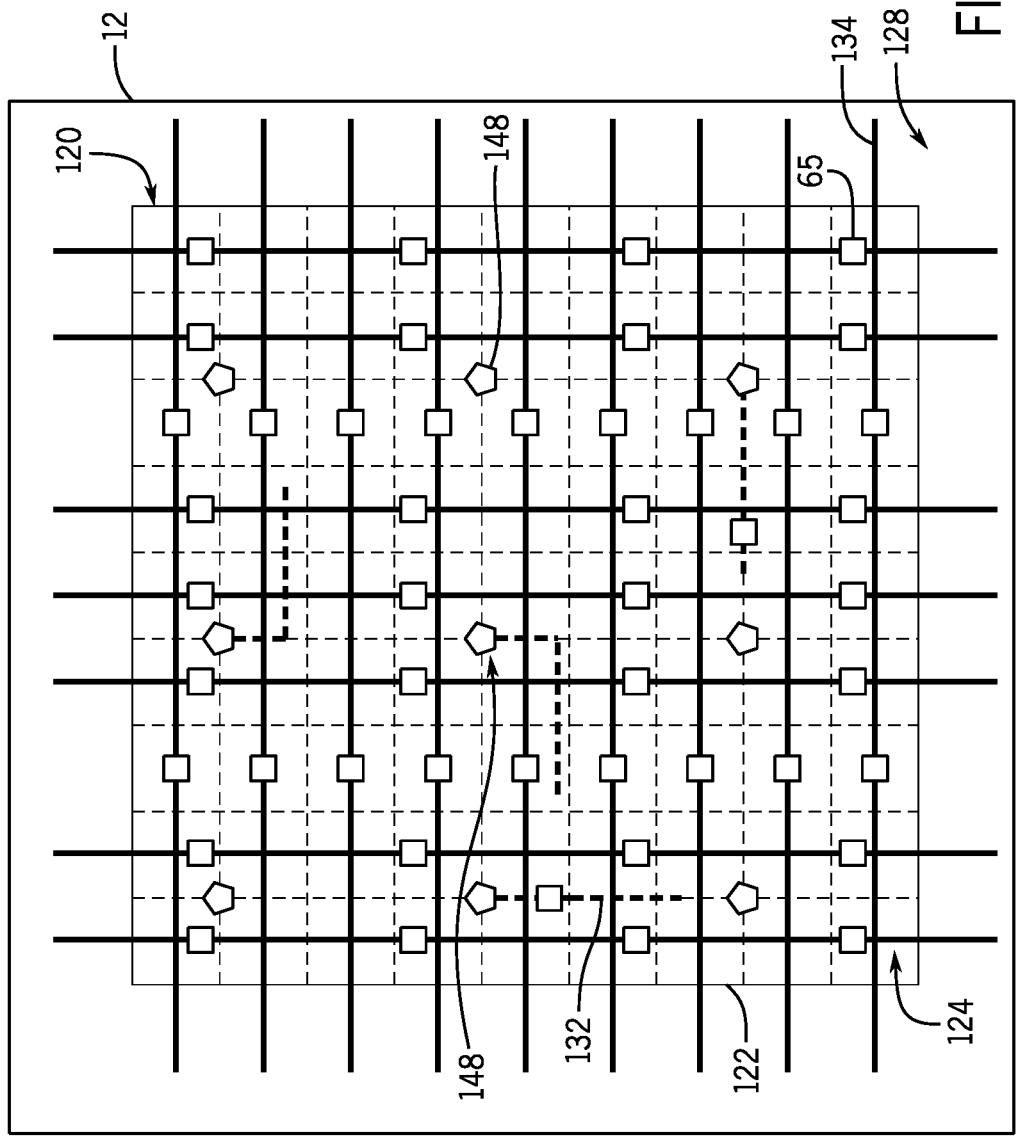
FIG. 11 is a block diagram of an integrated circuit device that includes partial reconfiguration persona bridge connection to a soft NOC, in accordance with an embodiment.

In some embodiments, the soft NOC contains transmit and receive bridges 148 that enable connections between the partial reconfiguration persona and a soft NOC (indicated by the static route 134), which is shown in FIG. 11. The bridges 148 may be located in one or more static regions, one or more partial reconfiguration regions, partially in one or more static regions and partially in one or more partial reconfiguration regions, or a combination thereof. Additionally, it should be noted that although FIG. 11 shows this in the context of the distributed soft NOC, a similar construction may be done for the concentrated or island-hopping embodiments of the soft NOC discussed above.

In some embodiments, the bridges 148 are constructed using LAB resources such as ALMs and ALM flip-flops. In some embodiments, look-up table RAM may be used as a buffer to construct the bridges 148. In some embodiments, M20K and other forms of fabric memory (e.g. M144K) may be used as buffers to construct the bridges 148. In some embodiments, a combination of these IP block 124 resources and direct connections are used to construct the data/control plane of the soft NOC. In some embodiments, a control plane coordinates the flow of data on the soft NOC between a static region 128 and a partial reconfiguration persona 144 interfacing the soft NOC.

Figure 12:
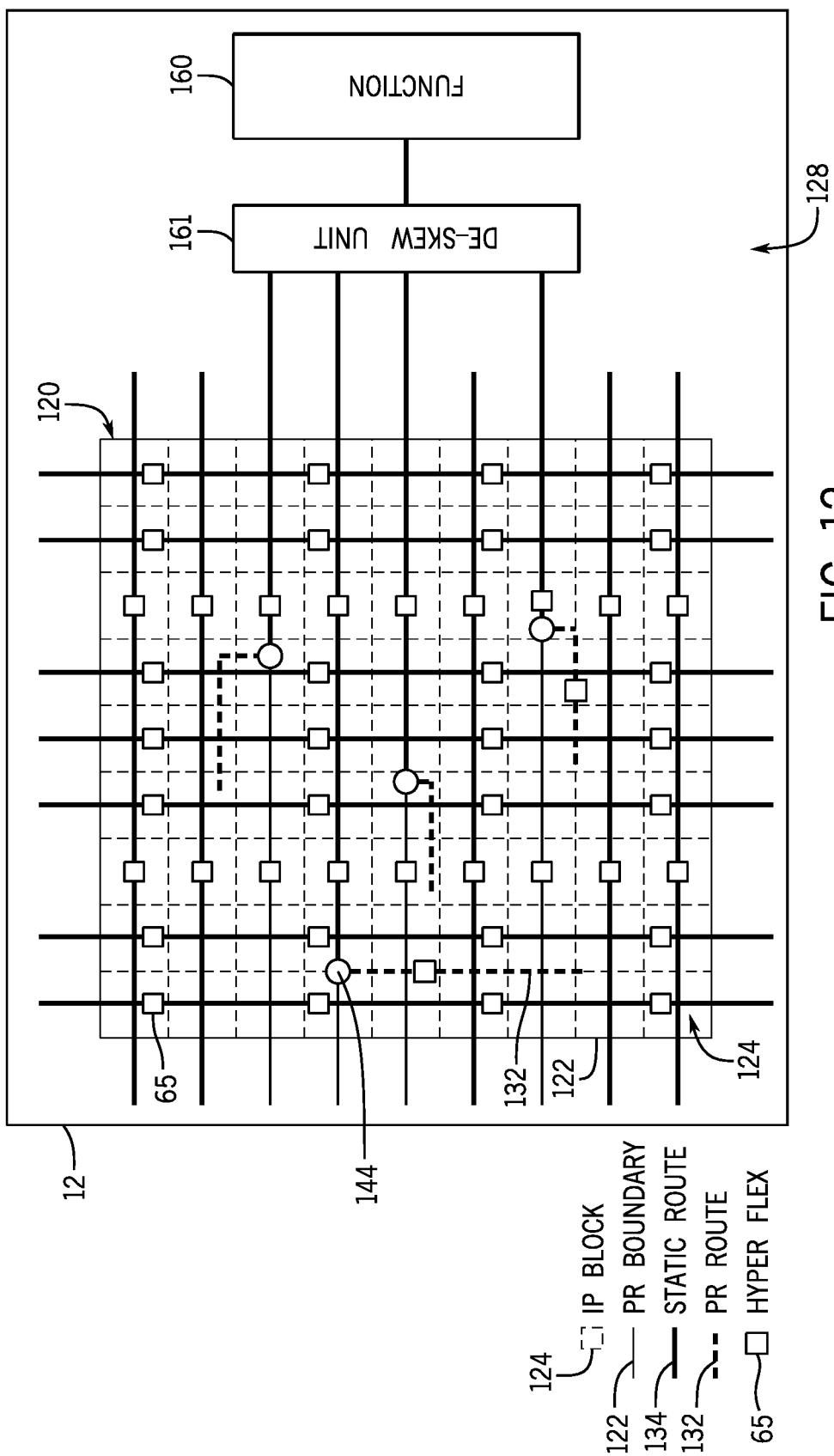
FIG. 12 is a block diagram of an integrated circuit device that includes partial reconfiguration persona to soft NOC to de-skew to function connections, in accordance with an embodiment.

In some embodiments, the static region soft NOC may not define an interface but rather provide pure transport. In some embodiments, points in an underlying partial reconfiguration persona are tapped as inputs to, or outputs from, the soft NOC that are directly stitched using a techniques such as partial reconfiguration, direct bitstream editing, or static random-access memory (SRAM) object file (SOF) editing. Upon connection, the soft NOC may be edited to avoid contention and create new point-to-point connections between the partial reconfiguration persona and the static region 128. As shown in FIG. 12, connections may be analyzed to understand an interface 160 and how to de-skew the interface 160 (e.g., using de-skew unit 161) to recreate partial reconfiguration persona constructions at a consistent time frame. More specifically, the de-skewed interface 160 may be attached to another interface, such as soft or hard logic that provides inputs and/or outputs to a partial reconfiguration persona. Furthermore, it should be noted that while FIG. 12 shows this in the context of a distributed soft NOC, in other embodiments, a similar transformation may be done for other versions of the soft NOC, such as the concentrated or island-hopping versions of the soft NOC discussed above.

Figure 13:
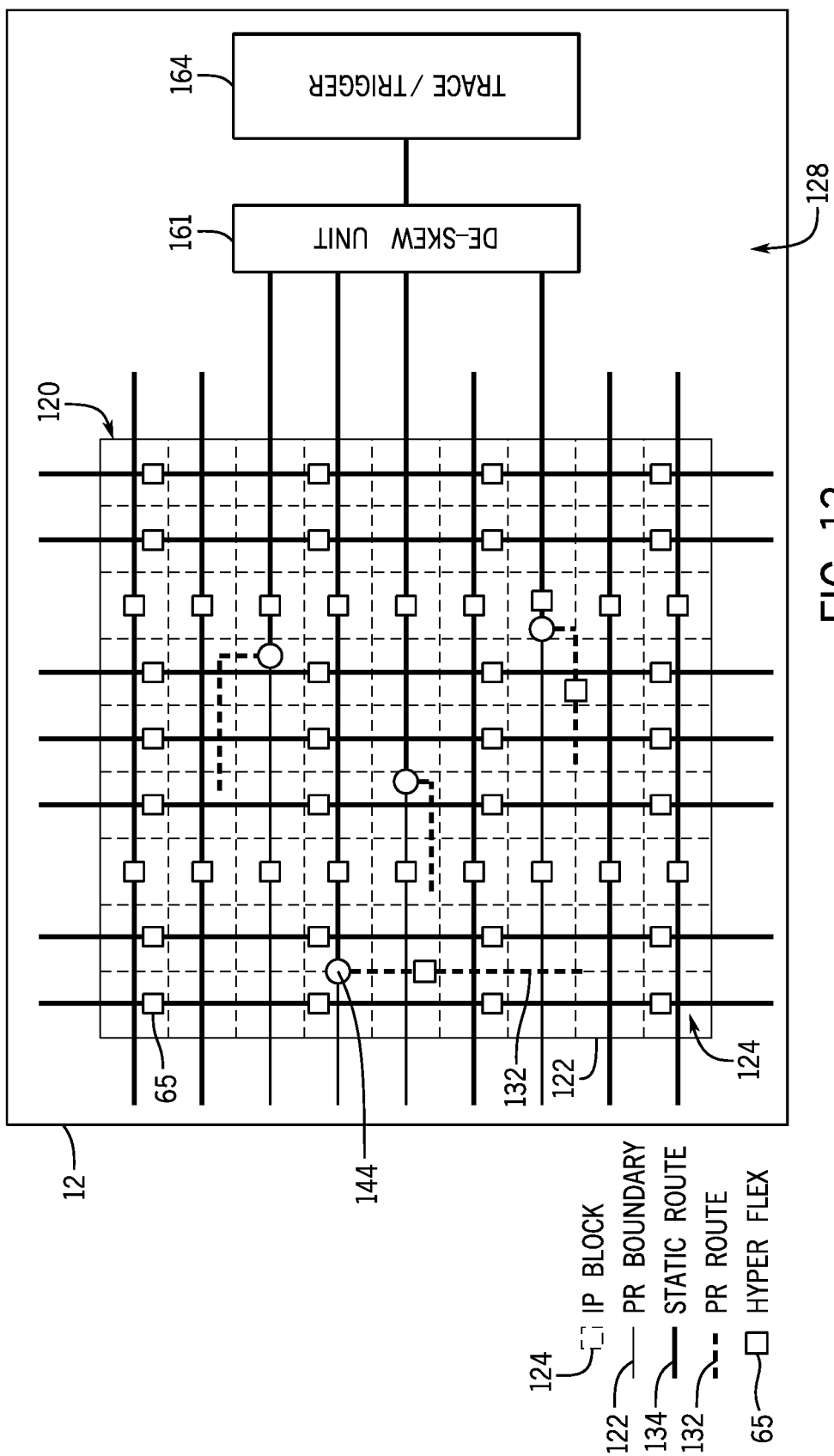
FIG. 13 is a block diagram of an integrated circuit device that includes partial reconfiguration persona to soft NOC to de-skew to trace or trigger connections, in accordance with an embodiment.

Turning to FIG. 13, as another example, the interface 160 may be a trace/trigger unit 164 built in either soft or hard logic of the integrated circuit device 12 to enable debugging. Similar to FIG. 12, although FIG. 13 illustrates a distributed soft NOC, in other embodiments, the trace/trigger unit 164 may be utilized in other types of NOCs discussed herein, such as the concentrated or island-hopping versions of the soft NOC described above.

Figure 14:
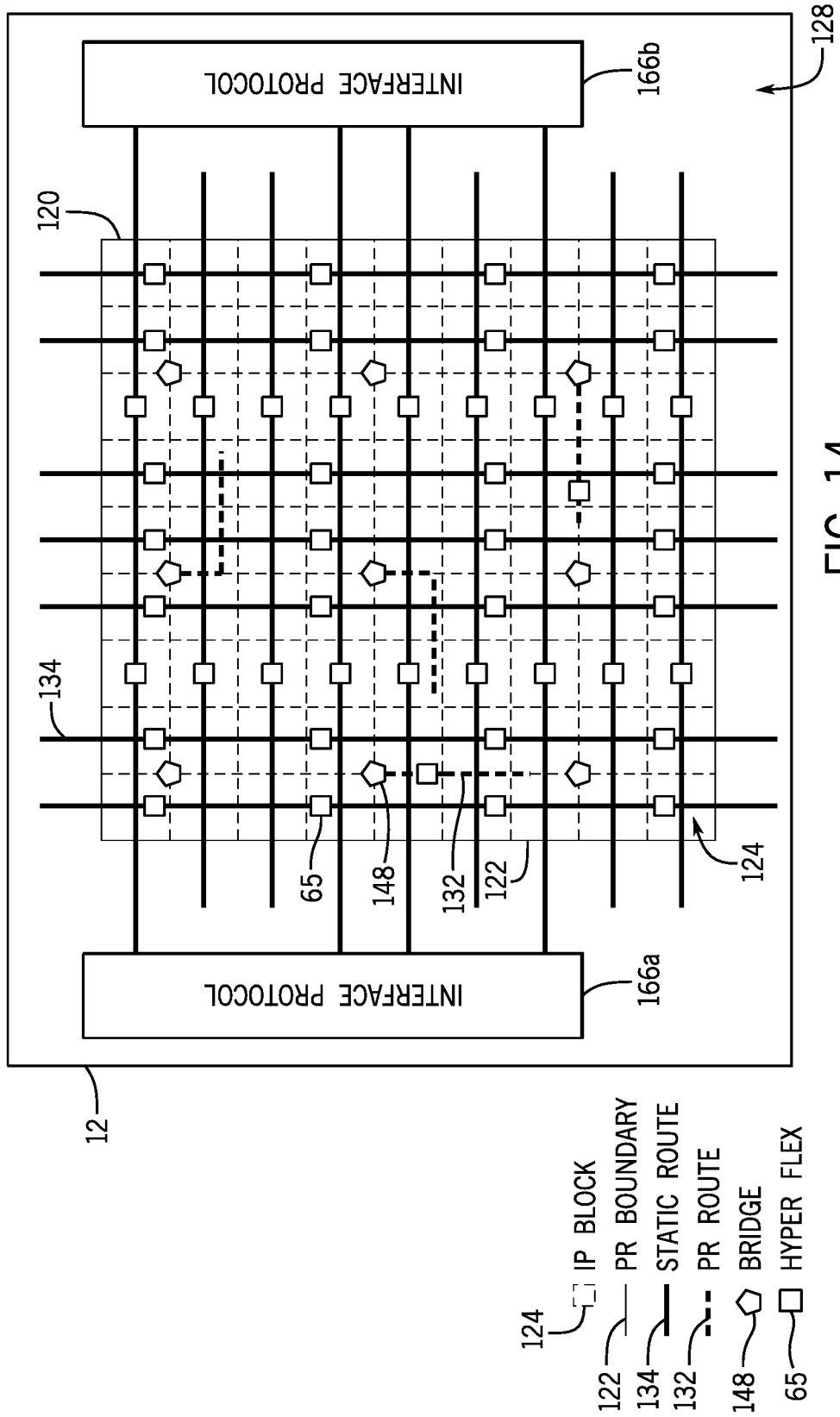
FIG. 14 is a block diagram of an integrated circuit device that includes a partial reconfiguration persona to soft NOC to interface connection, in accordance with an embodiment.

Additionally, in some embodiments, the static region soft NOC defines an interface 160 (e.g. Avalon Streaming Interface (AVST), Avalon Memory-Mapped (AVMM), Advanced eXtensible Interface (AXI), or other interfaces) for partial reconfiguration personas in a partial reconfiguration region 120 to connect to. The connections may be regular partial reconfiguration region 120 to static region 128 connections to the bridges presented by the static region 128. For example, such as construction may follow what is shown in FIG. 11 with well-defined interface points on the bridges 148. As another example, as illustrated in FIG. 14, the soft NOC may connect to interface protocols 166 (e.g., interface protocol 166A and interface protocol 166B) in the static region 128 to provide inputs and/or outputs to the partial reconfiguration persona. In some embodiments, the static and PR persona may be fused to create a single static region 144 design. Additionally, although FIG. 14 includes a distributed soft NOC, in other embodiments, the interface protocols 166 may be coupled to other types of soft NOCs, such as the concentrated or island-hopping versions of the soft NOC discussed above. Furthermore, it should be noted that, in some embodiments, a combination of one or more of the interface protocols 166 and de-skewing/late binding of the interface 160 may be combined.

Accordingly, the presently disclosed techniques enable the construction of point-to-point soft NOCs that may be embedded inside of a partial reconfiguration region of a programmable logic device and remain active when a partial reconfiguration operation is performed. In other words, the soft NOC remains active, thereby enabling uninterrupted data transport through the partial reconfiguration region.

Figure 15:
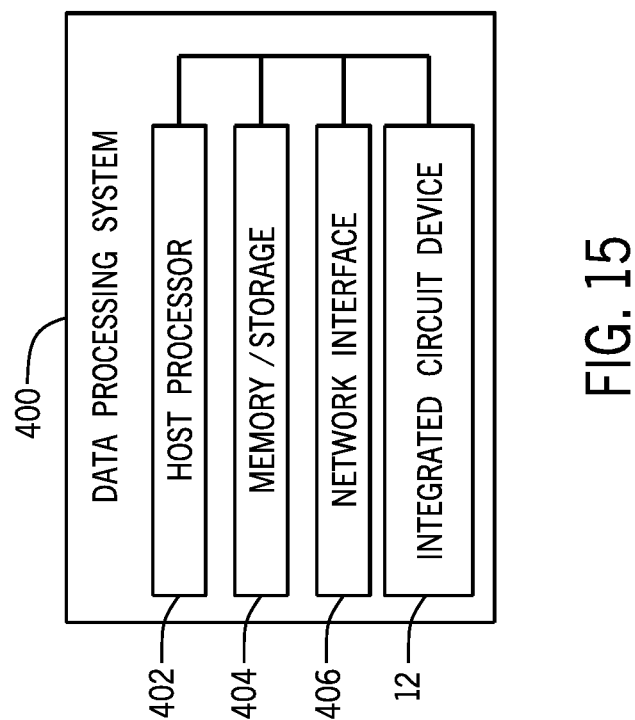
FIG. 15 is a block diagram of a data processing system that includes the integrated circuit of FIG. 1, in accordance with an embodiment.

Keeping the foregoing in mind, the integrated circuit device 12 (e.g., integrated circuit device 12A) may be a part of a data processing system or may be a component of a data processing system that may benefit from use of the techniques discussed herein. For example, the integrated circuit device 12 may be a component of a data processing system 400, shown in FIG. 15. The data processing system 400 includes a host processor 402, memory and/or storage circuitry 404, and a network interface 406. The data processing system 400 may include more or fewer components (e.g., electronic display, user interface structures, application specific integrated circuits (ASICs)).

The host processor 402 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 400 (e.g., to perform machine learning, video processing, voice recognition, image recognition, data compression, database search ranking, bioinformatics, network security pattern identification, spatial navigation, or the like). The memory and/or storage circuitry 404 may include random access memory (RAM), read-only memory (ROM), one or more hard drives, flash memory, or the like. The memory and/or storage circuitry 404 may be considered external memory to the integrated circuit device 12 and may hold data to be processed by the data processing system 400 and/or may be internal to the integrated circuit device 12. In some cases, the memory and/or storage circuitry 404 may also store configuration programs (e.g., bitstream) for programming a programmable fabric of the integrated circuit device 12. The network interface 406 may permit the data processing system 400 to communicate with other electronic devices. The data processing system 400 may include several different packages or may be contained within a single package on a single package substrate.

In one example, the data processing system 400 may be part of a data center that processes a variety of different requests. For instance, the data processing system 400 may receive a data processing request via the network interface 406 to perform machine learning, video processing, voice recognition, image recognition, data compression, database search ranking, bioinformatics, network security pattern identification, spatial navigation, or some other specialized task. The host processor 402 may cause a programmable logic fabric of the integrated circuit device 12 to be programmed with a particular accelerator related to requested task. For instance, the host processor 402 may instruct that configuration data (bitstream) be stored on the memory and/or storage circuitry 404 or cached in sector-aligned memory of the integrated circuit device 12 to be programmed into the programmable logic fabric of the integrated circuit device 12. The configuration data (bitstream) may represent a circuit design for a particular accelerator function relevant to the requested task.

The processes and devices of this disclosure may be incorporated into any suitable circuit. For example, the processes and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

CLAUSE 1.

An integrated circuit device comprising:
a programmable logic fabric comprising programmable logic circuitry and a partial reconfiguration region; and
a network-on-chip (NOC) formed in soft logic of the integrated circuit device, wherein the NOC is configurable to remain operable during a partial reconfiguration of the partial reconfiguration region.

CLAUSE 2.

The integrated circuit device of clause 1, wherein the NOC is a static overlay that is embedded inside the partial reconfiguration region.

CLAUSE 3.

The integrated circuit device of clause 1, wherein the NOC comprises a plurality of specialized registers connected by a plurality of routing wires of the integrated circuit device.

CLAUSE 4.

The integrated circuit device of clause 2, wherein each specialized register of the plurality of specialized registers comprises a register and a multiplexer.

CLAUSE 5.

The integrated circuit device of clause 4, wherein each specialized register of the plurality of specialized registers is configurable to route data to the multiplexer without routing the data through the register.

CLAUSE 6.

The integrated circuit device of clause 1, wherein the integrated circuit device comprises a field-programmable gate array (FPGA).

CLAUSE 7.

The integrated circuit device of clause 6, wherein a first portion of the NOC is transverses the partial reconfiguration region, wherein the first portion of the NOC is configured to transport date while the partial reconfiguration region undergoes the partial reconfiguration.

CLAUSE 8.

The integrated circuit device of clause 1, comprising a second partial reconfiguration that is separated from the partial reconfiguration region by a static region of the programmable logic fabric.

CLAUSE 9.

An integrated circuit device comprising:
a programmable logic fabric comprising programmable logic circuitry, wherein the programmable logic fabric comprises a static region; and
a network-on-chip (NOC) formed in soft logic of the integrated circuit device and at least partially in the static region, and wherein the NOC comprises a plurality of specialized registers connected by a plurality of routing wires of the integrated circuit device.

CLAUSE 10.

The integrated circuit device of clause 9, wherein the programmable logic fabric comprises a partial reconfiguration region, and wherein the NOC is implemented at least partially in the partial reconfiguration region.

CLAUSE 11.

The integrated circuit device of clause 10, wherein the integrated circuit device is configurable to:
form a first data route from the partial reconfiguration region to the NOC when operating in a first mode; and
as a result of performing a partial reconfiguration operation, form a second data route from the partial reconfiguration region to the NOC.

CLAUSE 12.

The integrated circuit device of clause 10, wherein the partial reconfiguration region comprises an input into the NOC or an output from the NOC.

CLAUSE 13.

The integrated circuit device of clause 9, comprising a de-skew unit communicatively coupled to the NOC, wherein the de-skew unit is configured to de-skew an interface of the integrated circuit device.

CLAUSE 14.

The integrated circuit device of clause 13, comprising a function block communicatively coupled to the de-skew unit.

CLAUSE 15.

The integrated circuit device of clause 9, comprising an interface protocol communicatively coupled to the NOC.

CLAUSE 16.

The integrated circuit device of clause 9, wherein each specialized register of the plurality of specialized registers comprises a register and a multiplexer, and wherein each specialized register of the plurality of specialized registers is configurable to route data to the multiplexer without routing the data through the register.

CLAUSE 17.

The integrated circuit device of clause 9, comprising a plurality of partial reconfiguration regions that are separated by one or more static regions, wherein the NOC is disposed entirely within the one or more static regions.

CLAUSE 18.

A non-transitory computer-readable medium comprising instructions that, when executed, are configured to cause one or more processors to:
receive data regarding an integrated circuit and data regarding performance characteristics for a network-on-chip (NoC) to be designed;
generate a design for the NOC; and
generate instructions configured to cause circuitry corresponding to the NoC to be implemented on the integrated circuit, wherein when implemented on the integrated circuit, the NOC remains operational when a partial reconfiguration region undergoes a partial reconfiguration.

CLAUSE 19.

The non-transitory computer-readable medium of clause 18, wherein the NOC is implemented in soft logic of the integrated circuit.

CLAUSE 20.

The non-transitory computer-readable medium of clause 18, wherein the NOC is at least partially implemented in a partial reconfiguration region of the integrated circuit.

What is claimed is:

1. An integrated circuit device comprising:
a programmable logic fabric comprising programmable logic circuitry and a partial reconfiguration region; and
a network-on-chip (NOC) formed in soft logic of the integrated circuit device, wherein the NOC is configurable to remain operable during a partial reconfiguration of the partial reconfiguration region, wherein the NOC is a static overlay that is embedded inside the partial reconfiguration region.

2. The integrated circuit device of claim 1, wherein the NOC comprises a plurality of specialized registers connected by a plurality of routing wires of the integrated circuit device.

3. The integrated circuit device of claim 2, wherein each specialized register of the plurality of specialized registers comprises a register and a multiplexer.

4. The integrated circuit device of claim 3, wherein each specialized register of the plurality of specialized registers is configurable to route data to the multiplexer without routing the data through the register.

5. The integrated circuit device of claim 1, wherein the integrated circuit device comprises a field-programmable gate array (FPGA).

6. The integrated circuit device of claim 5, wherein a first portion of the NOC transverses the partial reconfiguration region, wherein the first portion of the NOC is configured to transport date while the partial reconfiguration region undergoes the partial reconfiguration.

7. The integrated circuit device of claim 1, comprising a second partial reconfiguration that is separated from the partial reconfiguration region by a static region of the programmable logic fabric.

8. The integrated circuit device of claim 1, wherein the integrated circuit device is configurable to:
form a first data route from the partial reconfiguration region to the NOC when operating in a first mode; and
as a result of performing the partial reconfiguration, form a second data route from the partial reconfiguration region to the NOC.

9. An integrated circuit device comprising:
a programmable logic fabric comprising programmable logic circuitry, wherein the programmable logic fabric comprises a static region; and
a network-on-chip (NOC) formed in soft logic of the integrated circuit device and at least partially in the static region, and wherein the NOC comprises a plurality of specialized registers connected by a plurality of routing wires of the integrated circuit device.

10. The integrated circuit device of claim 9, wherein the programmable logic fabric comprises a partial reconfiguration region, and wherein the NOC is implemented at least partially in the partial reconfiguration region.

11. The integrated circuit device of claim 10, wherein the integrated circuit device is configurable to:
form a first data route from the partial reconfiguration region to the NOC when operating in a first mode; and
as a result of performing a partial reconfiguration operation, form a second data route from the partial reconfiguration region to the NOC.

12. The integrated circuit device of claim 10, wherein the partial reconfiguration region comprises an input into the NOC or an output from the NOC.

13. The integrated circuit device of claim 9, comprising a de-skew unit communicatively coupled to the NOC, wherein the de-skew unit is configured to de-skew an interface of the integrated circuit device.

14. The integrated circuit device of claim 13, comprising a function block communicatively coupled to the de-skew unit.

15. The integrated circuit device of claim 9, comprising an interface protocol communicatively coupled to the NOC.

16. The integrated circuit device of claim 9, wherein each specialized register of the plurality of specialized registers comprises a register and a multiplexer, and wherein each specialized register of the plurality of specialized registers is configurable to route data to the multiplexer without routing the data through the register.

17. The integrated circuit device of claim 9, comprising a plurality of partial reconfiguration regions that are separated by one or more static regions, wherein the NOC is disposed entirely within the one or more static regions.

18. A non-transitory computer-readable medium comprising instructions that, when executed, are configured to cause one or more processors to:
receive data regarding an integrated circuit and data regarding performance characteristics for a network-on-chip (NoC) to be designed;
generate a design for the NOC; and
generate instructions configured to cause circuitry corresponding to the NoC to be implemented on the integrated circuit, wherein when implemented on the integrated circuit, the NOC remains operational when a partial reconfiguration region undergoes a partial reconfiguration.

19. The non-transitory computer-readable medium of claim 18, wherein the NOC is implemented in soft logic of the integrated circuit.

20. The non-transitory computer-readable medium of claim 18, wherein the NOC is at least partially implemented in a partial reconfiguration region of the integrated circuit.

* * * * *